US012702064B2

(12) United States Patent
Gao et al.

(10) Patent No.: US 12,702,064 B2
(45) Date of Patent: Aug. 4, 2026

(54) POWER DISTRIBUTION FOR STACKED ELECTRONIC DEVICES

(71) Applicant: ADEIA SEMICONDUCTOR BONDING TECHNOLOGIES INC., San Jose, CA (US)

(72) Inventors: Guilian Gao, San Jose, CA (US); Gaius Gillman Fountain, Jr., Youngsville, NC (US); Belgacem Haba, Saratoga, CA (US)

(73) Assignee: Adeia Semiconductor Bonding Technologies Inc., San Jose, CA (US)

( * ) Notice: Subject to any disclaimer, the term of this patent is extended or adjusted under 35 U.S.C. 154(b) by 752 days.

(21) Appl. No.: 18/048,586

(22) Filed: Oct. 21, 2022

(65) Prior Publication Data

US 2023/0187412 A1      Jun. 15, 2023

Related U.S. Application Data

(60) Provisional application No. 63/263,004, filed on Oct. 25, 2021.

(51) Int. Cl.
*H10W 90/00* (2026.01)
*H10W 90/20* (2026.01)
*H10W 90/28* (2026.01)

(52) U.S. Cl.
CPC ............ *H10W 90/00* (2026.01); *H10W 90/20* (2026.01); *H10W 90/28* (2026.01);
(Continued)

(58) Field of Classification Search
None
See application file for complete search history.

(56) References Cited

U.S. PATENT DOCUMENTS 5,571,754 A * 11/1996 Bertin ................. H01L 25/0657
438/666
5,753,536 A 5/1998 Sugiyama et al.
(Continued)

FOREIGN PATENT DOCUMENTS

CN           115004363 A      9/2022
JP        2013-033786 A      2/2013
(Continued)

OTHER PUBLICATIONS

Aleksandark, "Intel Details Ponte Vecchio Accelerator: 63 Tiles, 600 Watt TDP, and Lots of Bandwidth," TECHPOWERUP, https://www.techpowerup.com/292250/intel-details-ponte-vecchio-accelerator-63-tiles-600-watt-tdp-and-lots-of-bandwidth, Feb. 22, 2022 (printed Mar. 19, 2024), 5 pages.
(Continued)

*Primary Examiner* — Hung K Vu
(74) *Attorney, Agent, or Firm* — Knobbe, Martens, Olson & Bear, LLP

(57) ABSTRACT

A stacked electronic device is disclosed. The stacked electronic device can comprise a die stack including two or more connected dies, such as a lower die, an upper die, and a middle die between the lower die and the upper die. A plurality of through substrate vias (TSVs) can provide signal transmission to dies of the stack. A power supply path can be configured to provide power to the middle die without passing through the lower die. In some embodiments, external paths can provide power through an upper surface of a die in the stack while signals are supplied through the lower surface.

20 Claims, 6 Drawing Sheets

(52) U.S. Cl.
CPC ........ *H10W 90/293* (2026.01); *H10W 90/297* (2026.01); *H10W 90/754* (2026.01); *H10W 90/792* (2026.01)

(56) References Cited

U.S. PATENT DOCUMENTS

| | | | |
|---|---|---|---|
| 5,771,555 A | 6/1998 | Eda et al. | |
| 6,080,640 A | 6/2000 | Gardner et al. | |
| 6,423,640 B1 | 7/2002 | Lee et al. | |
| 6,465,892 B1 | 10/2002 | Suga | |
| 6,887,769 B2 | 5/2005 | Kellar et al. | |
| 6,908,027 B2 | 6/2005 | Tolchinsky et al. | |
| 7,045,453 B2 | 5/2006 | Canaperi et al. | |
| 7,105,980 B2 | 9/2006 | Abbott et al. | |
| 7,193,423 B1 | 3/2007 | Dalton et al. | |
| 7,750,488 B2 | 7/2010 | Patti et al. | |
| 7,803,693 B2 | 9/2010 | Trezza | |
| 8,183,127 B2 | 5/2012 | Patti et al. | |
| 8,349,635 B1 | 1/2013 | Gan et al. | |
| 8,377,798 B2 | 2/2013 | Peng et al. | |
| 8,441,131 B2 | 5/2013 | Ryan | |
| 8,461,673 B2 | 6/2013 | Haba et al. | |
| 8,476,165 B2 | 7/2013 | Trickett et al. | |
| 8,482,132 B2 | 7/2013 | Yang et al. | |
| 8,501,537 B2 | 8/2013 | Sadaka et al. | |
| 8,524,533 B2 | 9/2013 | Tong et al. | |
| 8,620,164 B2 | 12/2013 | Heck et al. | |
| 8,647,987 B2 | 2/2014 | Yang et al. | |
| 8,656,333 B1 | 2/2014 | Bishop et al. | |
| 8,697,493 B2 | 4/2014 | Sadaka | |
| 8,716,105 B2 | 5/2014 | Sadaka et al. | |
| 8,802,538 B1 | 8/2014 | Liu | |
| 8,803,334 B2 | 8/2014 | Choi et al. | |
| 8,809,123 B2 | 8/2014 | Liu et al. | |
| 8,841,002 B2 | 9/2014 | Tong | |
| 8,957,529 B2 | 2/2015 | Park et al. | |
| 9,093,350 B2 | 7/2015 | Endo et al. | |
| 9,142,517 B2 | 9/2015 | Liu et al. | |
| 9,171,756 B2 | 10/2015 | Enquist et al. | |
| 9,184,125 B2 | 11/2015 | Enquist et al. | |
| 9,224,704 B2 | 12/2015 | Landru | |
| 9,230,941 B2 | 1/2016 | Chen et al. | |
| 9,257,399 B2 | 2/2016 | Kuang et al. | |
| 9,299,736 B2 | 3/2016 | Chen et al. | |
| 9,312,229 B2 | 4/2016 | Chen et al. | |
| 9,331,149 B2 | 5/2016 | Tong et al. | |
| 9,337,235 B2 | 5/2016 | Chen et al. | |
| 9,385,024 B2 | 7/2016 | Tong et al. | |
| 9,391,143 B2 | 7/2016 | Tong et al. | |
| 9,394,161 B2 | 7/2016 | Cheng et al. | |
| 9,431,368 B2 | 8/2016 | Enquist et al. | |
| 9,437,572 B2 | 9/2016 | Chen et al. | |
| 9,443,796 B2 | 9/2016 | Chou et al. | |
| 9,461,007 B2 | 10/2016 | Chun et al. | |
| 9,496,239 B1 | 11/2016 | Edelstein et al. | |
| 9,536,848 B2 | 1/2017 | England et al. | |
| 9,559,040 B2 | 1/2017 | Batra et al. | |
| 9,559,081 B1 | 1/2017 | Lai et al. | |
| 9,589,905 B2 | 3/2017 | Choi et al. | |
| 9,620,481 B2 | 4/2017 | Edelstein et al. | |
| 9,656,852 B2 | 5/2017 | Cheng et al. | |
| 9,723,716 B2 | 8/2017 | Meinhold | |
| 9,728,521 B2 | 8/2017 | Tsai et al. | |
| 9,741,620 B2 | 8/2017 | Uzoh et al. | |
| 9,799,587 B2 | 10/2017 | Fujii et al. | |
| 9,852,988 B2 | 12/2017 | Enquist et al. | |
| 9,893,004 B2 | 2/2018 | Yazdani | |
| 9,929,050 B2 | 3/2018 | Lin | |
| 9,941,241 B2 | 4/2018 | Edelstein et al. | |
| 9,941,243 B2 | 4/2018 | Kim et al. | |
| 9,953,941 B2 | 4/2018 | Enquist | |
| 9,960,142 B2 | 5/2018 | Chen et al. | |
| 10,002,844 B1 | 6/2018 | Wang et al. | |
| 10,026,605 B2 | 7/2018 | Doub et al. | |
| 10,036,734 B2 | 7/2018 | Fennell et al. | |
| 10,075,657 B2 | 9/2018 | Fahim et al. | |
| 10,204,893 B2 | 2/2019 | Uzoh et al. | |
| 10,269,756 B2 | 4/2019 | Uzoh | |
| 10,276,619 B2 | 4/2019 | Kao et al. | |
| 10,276,909 B2 | 4/2019 | Huang et al. | |
| 10,418,277 B2 | 9/2019 | Cheng et al. | |
| 10,446,456 B2 | 10/2019 | Shen et al. | |
| 10,446,487 B2 | 10/2019 | Huang et al. | |
| 10,446,532 B2 | 10/2019 | Uzoh et al. | |
| 10,508,030 B2 | 12/2019 | Katkar et al. | |
| 10,522,499 B2 | 12/2019 | Enquist et al. | |
| 10,580,735 B2 | 3/2020 | Mohammed et al. | |
| 10,586,786 B2 | 3/2020 | DeLaCruz et al. | |
| 10,593,667 B2 | 3/2020 | DeLaCruz et al. | |
| 10,600,691 B2 | 3/2020 | DeLaCruz et al. | |
| 10,600,735 B2 | 3/2020 | DeLaCruz et al. | |
| 10,600,780 B2 | 3/2020 | DeLaCruz et al. | |
| 10,636,739 B2 | 4/2020 | Beyne et al. | |
| 10,658,335 B2 | 5/2020 | Gu et al. | |
| 10,672,663 B2 | 6/2020 | DeLaCruz et al. | |
| 10,707,087 B2 | 7/2020 | Uzoh et al. | |
| 10,784,191 B2 | 9/2020 | Huang et al. | |
| 10,790,262 B2 | 9/2020 | Uzoh et al. | |
| 10,840,135 B2 | 11/2020 | Uzoh | |
| 10,840,205 B2 | 11/2020 | Fountain, Jr. et al. | |
| 10,854,578 B2 | 12/2020 | Morein | |
| 10,879,212 B2 | 12/2020 | Uzoh et al. | |
| 10,886,177 B2 | 1/2021 | DeLaCruz et al. | |
| 10,892,246 B2 | 1/2021 | Uzoh | |
| 10,923,408 B2 | 2/2021 | Huang et al. | |
| 10,923,413 B2 | 2/2021 | DeLaCruz | |
| 10,950,547 B2 | 3/2021 | Mohammed et al. | |
| 10,964,664 B2 | 3/2021 | Mandalapu et al. | |
| 10,978,348 B2 | 4/2021 | DeLaCruz et al. | |
| 10,985,133 B2 | 4/2021 | Uzoh | |
| 10,991,804 B2 | 4/2021 | DeLaCruz et al. | |
| 10,998,292 B2 | 5/2021 | Lee et al. | |
| 11,004,757 B2 | 5/2021 | Katkar et al. | |
| 11,011,494 B2 | 5/2021 | Gao et al. | |
| 11,011,503 B2 | 5/2021 | Wang et al. | |
| 11,031,285 B2 | 6/2021 | Katkar et al. | |
| 11,037,919 B2 | 6/2021 | Uzoh et al. | |
| 11,056,348 B2 | 7/2021 | Theil | |
| 11,069,734 B2 | 7/2021 | Katkar | |
| 11,088,099 B2 | 8/2021 | Katkar et al. | |
| 11,127,738 B2 | 9/2021 | DeLaCruz et al. | |
| 11,158,606 B2 | 10/2021 | Gao et al. | |
| 11,171,117 B2 | 11/2021 | Gao et al. | |
| 11,176,450 B2 | 11/2021 | Teig et al. | |
| 11,194,726 B2 | 12/2021 | Gans | |
| 11,256,004 B2 | 2/2022 | Haba et al. | |
| 11,264,357 B1 | 3/2022 | DeLaCruz et al. | |
| 11,276,676 B2 | 3/2022 | Enquist et al. | |
| 11,296,044 B2 | 4/2022 | Gao et al. | |
| 11,329,034 B2 | 5/2022 | Tao et al. | |
| 11,348,898 B2 | 5/2022 | DeLaCruz et al. | |
| 11,355,443 B2 | 6/2022 | Huang et al. | |
| 11,557,516 B2 | 1/2023 | DeLaCruz et al. | |
| 2004/0084414 A1 | 5/2004 | Sakai et al. | |
| 2006/0057945 A1 | 3/2006 | Hsu et al. | |
| 2007/0111386 A1 | 5/2007 | Kim et al. | |
| 2007/0181991 A1 | 8/2007 | Ishino et al. | |
| 2008/0237310 A1 | 10/2008 | Periaman et al. | |
| 2008/0315333 A1 | 12/2008 | Combi et al. | |
| 2011/0272798 A1 | 11/2011 | Lee et al. | |
| 2012/0299191 A1* | 11/2012 | Camacho ................ H01L 24/97 |
| | | | 438/109 |
| 2014/0175655 A1 | 6/2014 | Chen et al. | |
| 2015/0014860 A1* | 1/2015 | Jang ........................ H01L 24/05 |
| | | | 257/774 |
| 2015/0021789 A1 | 1/2015 | Lin | |
| 2015/0031189 A1 | 1/2015 | Chen et al. | |
| 2015/0064498 A1 | 3/2015 | Tong | |
| 2015/0116968 A1 | 4/2015 | Yamada et al. | |
| 2016/0233264 A1 | 8/2016 | Kagawa et al. | |
| 2016/0343682 A1 | 11/2016 | Kawasaki | |
| 2016/0343762 A1 | 11/2016 | Kagawa et al. | |
| 2017/0200698 A1 | 7/2017 | Graf et al. | |
| 2017/0221950 A1 | 8/2017 | Ho et al. | |

(56) References Cited

U.S. PATENT DOCUMENTS

| | | | |
|---|---|---|---|
| 2017/0271309 A1* | 9/2017 | Graf | H10D 64/00 |
| 2018/0005977 A1 | 1/2018 | Lin | |
| 2018/0175012 A1 | 6/2018 | Wu et al. | |
| 2018/0182639 A1 | 6/2018 | Uzoh et al. | |
| 2018/0182666 A1 | 6/2018 | Uzoh et al. | |
| 2018/0190580 A1 | 7/2018 | Haba et al. | |
| 2018/0190583 A1 | 7/2018 | DeLaCruz et al. | |
| 2018/0219038 A1 | 8/2018 | Gambino et al. | |
| 2018/0323177 A1 | 11/2018 | Yu et al. | |
| 2018/0323227 A1 | 11/2018 | Zhang et al. | |
| 2018/0331066 A1 | 11/2018 | Uzoh et al. | |
| 2019/0080969 A1 | 3/2019 | Tsao | |
| 2019/0096741 A1 | 3/2019 | Uzoh et al. | |
| 2019/0115277 A1 | 4/2019 | Yu et al. | |
| 2019/0131277 A1 | 5/2019 | Yang et al. | |
| 2019/0198409 A1 | 6/2019 | Katkar et al. | |
| 2019/0214424 A1 | 7/2019 | Borthakur et al. | |
| 2019/0265411 A1 | 8/2019 | Huang et al. | |
| 2019/0295986 A1* | 9/2019 | Oh | H01L 24/13 |
| 2019/0326252 A1 | 10/2019 | Mandalapu et al. | |
| 2019/0333550 A1 | 10/2019 | Fisch | |
| 2019/0355637 A1 | 11/2019 | Chen et al. | |
| 2019/0385935 A1 | 12/2019 | Gao et al. | |
| 2019/0385966 A1 | 12/2019 | Gao et al. | |
| 2020/0013637 A1 | 1/2020 | Haba | |
| 2020/0013765 A1 | 1/2020 | Fountain, Jr. et al. | |
| 2020/0035641 A1 | 1/2020 | Fountain, Jr. et al. | |
| 2020/0075534 A1 | 3/2020 | Gao et al. | |
| 2020/0075553 A1 | 3/2020 | DeLaCruz et al. | |
| 2020/0091072 A1* | 3/2020 | Naser | H01L 23/5226 |
| 2020/0105671 A1 | 4/2020 | Lai et al. | |
| 2020/0118973 A1 | 4/2020 | Wang et al. | |
| 2020/0126906 A1 | 4/2020 | Uzoh et al. | |
| 2020/0135654 A1 | 4/2020 | Lee et al. | |
| 2020/0194381 A1 | 6/2020 | Park | |
| 2020/0194396 A1 | 6/2020 | Uzoh | |
| 2020/0227367 A1 | 7/2020 | Haba et al. | |
| 2020/0243380 A1 | 7/2020 | Uzoh et al. | |
| 2020/0266169 A1 | 8/2020 | Kang et al. | |
| 2020/0279821 A1 | 9/2020 | Haba et al. | |
| 2020/0294908 A1 | 9/2020 | Haba et al. | |
| 2020/0312766 A1 | 10/2020 | Bhagavat et al. | |
| 2020/0321275 A1 | 10/2020 | Haba et al. | |
| 2020/0328162 A1 | 10/2020 | Haba et al. | |
| 2020/0328164 A1 | 10/2020 | DeLaCruz et al. | |
| 2020/0328165 A1 | 10/2020 | DeLaCruz et al. | |
| 2020/0335408 A1 | 10/2020 | Gao et al. | |
| 2020/0371154 A1 | 11/2020 | DeLaCruz et al. | |
| 2020/0373242 A1 | 11/2020 | Hiblot et al. | |
| 2020/0395304 A1 | 12/2020 | Chen et al. | |
| 2020/0395321 A1 | 12/2020 | Katkar et al. | |
| 2020/0411483 A1 | 12/2020 | Uzoh et al. | |
| 2021/0098412 A1 | 4/2021 | Haba et al. | |
| 2021/0098987 A1 | 4/2021 | Walimbe et al. | |
| 2021/0104494 A1* | 4/2021 | Vodrahalli | H01L 23/562 |
| 2021/0118849 A1 | 4/2021 | Limaye et al. | |
| 2021/0118864 A1 | 4/2021 | DeLaCruz et al. | |
| 2021/0138506 A1 | 5/2021 | Lee et al. | |
| 2021/0143125 A1 | 5/2021 | DeLaCruz et al. | |
| 2021/0181510 A1 | 6/2021 | Katkar et al. | |
| 2021/0193603 A1 | 6/2021 | Katkar et al. | |
| 2021/0193624 A1 | 6/2021 | DeLaCruz et al. | |
| 2021/0193625 A1 | 6/2021 | DeLaCruz et al. | |
| 2021/0242152 A1 | 8/2021 | Fountain, Jr. et al. | |
| 2021/0296282 A1 | 9/2021 | Gao et al. | |
| 2021/0305202 A1 | 9/2021 | Uzoh et al. | |
| 2021/0327797 A1 | 10/2021 | Wu et al. | |
| 2021/0366820 A1 | 11/2021 | Uzoh | |
| 2021/0407941 A1 | 12/2021 | Haba | |
| 2022/0077063 A1 | 3/2022 | Haba | |
| 2022/0077087 A1 | 3/2022 | Haba | |
| 2022/0077109 A1 | 3/2022 | Chava et al. | |
| 2022/0093564 A1 | 3/2022 | Chen et al. | |
| 2022/0130761 A1 | 4/2022 | Kim et al. | |
| 2022/0139867 A1 | 5/2022 | Uzoh | |
| 2022/0139869 A1 | 5/2022 | Gao et al. | |
| 2022/0157787 A1 | 5/2022 | Kim et al. | |
| 2022/0181263 A1 | 6/2022 | Liebmann et al. | |
| 2022/0208650 A1 | 6/2022 | Gao et al. | |
| 2022/0208702 A1 | 6/2022 | Uzoh | |
| 2022/0208723 A1 | 6/2022 | Katkar et al. | |
| 2022/0246497 A1 | 8/2022 | Fountain, Jr. et al. | |
| 2022/0271022 A1 | 8/2022 | Gomes et al. | |
| 2022/0285273 A1 | 9/2022 | Dabral et al. | |
| 2022/0285303 A1 | 9/2022 | Mirkarimi et al. | |
| 2022/0310489 A1 | 9/2022 | Yang et al. | |
| 2022/0319901 A1 | 10/2022 | Suwito et al. | |
| 2022/0320035 A1 | 10/2022 | Uzoh et al. | |
| 2022/0320036 A1 | 10/2022 | Gao et al. | |
| 2022/0336394 A1 | 10/2022 | Ishikawa et al. | |
| 2022/0367364 A1 | 11/2022 | Jeon et al. | |
| 2023/0005850 A1 | 1/2023 | Fountain, Jr. | |
| 2023/0019350 A1 | 1/2023 | Hwang et al. | |
| 2023/0019869 A1 | 1/2023 | Mirkarimi et al. | |
| 2023/0036441 A1 | 2/2023 | Haba et al. | |
| 2023/0060716 A1 | 3/2023 | Wu et al. | |
| 2023/0067677 A1 | 3/2023 | Lee et al. | |
| 2023/0069183 A1 | 3/2023 | Haba | |
| 2023/0095654 A1 | 3/2023 | Elsherbini et al. | |
| 2023/0100032 A1 | 3/2023 | Haba et al. | |
| 2023/0113296 A1 | 4/2023 | Farooq et al. | |
| 2023/0115122 A1 | 4/2023 | Uzoh et al. | |
| 2023/0122531 A1 | 4/2023 | Uzoh | |
| 2023/0123423 A1 | 4/2023 | Gao et al. | |
| 2023/0125395 A1 | 4/2023 | Gao et al. | |
| 2023/0128985 A1 | 4/2023 | Anderson et al. | |
| 2023/0130259 A1 | 4/2023 | Haba et al. | |
| 2023/0132632 A1 | 5/2023 | Katkar et al. | |
| 2023/0140107 A1 | 5/2023 | Uzoh et al. | |
| 2023/0142680 A1 | 5/2023 | Guevara et al. | |
| 2023/0154816 A1 | 5/2023 | Haba et al. | |
| 2023/0154828 A1 | 5/2023 | Haba et al. | |
| 2023/0187264 A1 | 6/2023 | Uzoh et al. | |
| 2023/0187317 A1 | 6/2023 | Uzoh | |
| 2023/0197453 A1 | 6/2023 | Fountain, Jr. et al. | |
| 2023/0197496 A1 | 6/2023 | Theil | |
| 2023/0197559 A1 | 6/2023 | Haba et al. | |
| 2023/0197560 A1 | 6/2023 | Katkar et al. | |
| 2023/0197655 A1 | 6/2023 | Theil et al. | |
| 2023/0207402 A1 | 6/2023 | Fountain, Jr. et al. | |
| 2023/0207437 A1 | 6/2023 | Haba | |
| 2023/0207474 A1 | 6/2023 | Uzoh et al. | |
| 2023/0207514 A1 | 6/2023 | Gao et al. | |
| 2023/0215836 A1 | 7/2023 | Haba et al. | |
| 2023/0245950 A1 | 8/2023 | Haba et al. | |
| 2023/0268300 A1 | 8/2023 | Uzoh et al. | |
| 2023/0299029 A1 | 9/2023 | Theil et al. | |
| 2023/0343734 A1 | 10/2023 | Uzoh et al. | |
| 2023/0360950 A1 | 11/2023 | Gao | |
| 2023/0361074 A1 | 11/2023 | Uzoh et al. | |
| 2023/0369136 A1 | 11/2023 | Uzoh et al. | |
| 2023/0375613 A1 | 11/2023 | Haba et al. | |
| 2024/0038702 A1 | 2/2024 | Uzoh | |
| 2024/0055407 A1 | 2/2024 | Workman et al. | |
| 2024/0079376 A1 | 3/2024 | Suwito et al. | |
| 2024/0105674 A1 | 3/2024 | Uzoh et al. | |
| 2024/0170411 A1 | 5/2024 | Chang et al. | |
| 2024/0186248 A1 | 6/2024 | Haba et al. | |
| 2024/0186268 A1 | 6/2024 | Uzoh et al. | |
| 2024/0186269 A1 | 6/2024 | Haba | |
| 2024/0203917 A1 | 6/2024 | Katkar et al. | |
| 2024/0213191 A1 | 6/2024 | Theil et al. | |
| 2024/0213210 A1 | 6/2024 | Haba et al. | |
| 2024/0217210 A1 | 7/2024 | Zhao et al. | |
| 2024/0222239 A1 | 7/2024 | Gao et al. | |
| 2024/0222315 A1 | 7/2024 | Uzoh | |
| 2024/0222319 A1 | 7/2024 | Gao et al. | |
| 2024/0266255 A1 | 8/2024 | Haba et al. | |
| 2024/0298454 A1 | 9/2024 | Haba | |
| 2024/0304593 A1 | 9/2024 | Uzoh | |
| 2024/0312951 A1 | 9/2024 | Theil et al. | |
| 2024/0332183 A1 | 10/2024 | Katkar et al. | |
| 2024/0332184 A1 | 10/2024 | Katkar et al. | |
| 2024/0332227 A1 | 10/2024 | Uzoh et al. | |

(56) References Cited

U.S. PATENT DOCUMENTS

| | | |
|---|---|---|
| 2024/0332231 A1 | 10/2024 | Uzoh |
| 2024/0332267 A1 | 10/2024 | Haba et al. |
| 2024/0387419 A1 | 11/2024 | Mrozek et al. |
| 2025/0004197 A1 | 1/2025 | Haba et al. |
| 2025/0006617 A1 | 1/2025 | Chang et al. |
| 2025/0006632 A1 | 1/2025 | Chang et al. |
| 2025/0006642 A1 | 1/2025 | Haba et al. |
| 2025/0006674 A1 | 1/2025 | Uzoh et al. |
| 2025/0006679 A1 | 1/2025 | Theil et al. |
| 2025/0006689 A1 | 1/2025 | Uzoh et al. |
| 2025/0054854 A1 | 2/2025 | Katkar et al. |
| 2025/0079364 A1 | 3/2025 | Uzoh et al. |
| 2025/0096191 A1 | 3/2025 | Gao et al. |
| 2025/0112123 A1 | 4/2025 | Katkar et al. |
| 2025/0185163 A1 | 6/2025 | Zhao et al. |
| 2025/0210585 A1 | 6/2025 | Fountain, Jr. et al. |
| 2025/0212554 A1 | 6/2025 | Katkar et al. |
| 2025/0218903 A1 | 7/2025 | Uzoh et al. |
| 2025/0273517 A1 | 8/2025 | Lee et al. |
| 2026/0068632 A1 | 3/2026 | Haba |

FOREIGN PATENT DOCUMENTS

| | | |
|---|---|---|
| JP | 2018-160519 | 10/2018 |
| KR | 10-0871381 B1 | 12/2008 |
| KR | 2021-0047607 A | 4/2021 |
| WO | WO 2005/043584 A2 | 5/2005 |
| WO | WO 2019/132960 A1 | 7/2019 |
| WO | WO 2023/122732 A1 | 6/2023 |

OTHER PUBLICATIONS

Blythe, David, "Ponte Vecchio," Hot Chips 33 Symposium, Aug. 24, 2021, 34 pages.

Bush, Steve, "Electronica: Automotive power modules from On Semi," ElectronicsWeekly.com, indicating an ONSEMI AR0820 product was to be demonstrated at a Nov. 2018 trade show, https://www.electronicsweekly.com/news/products/power-supplies/electronica-automotive-power-modules-semi-2018-11/ (published Nov. 8, 2018; downloaded Jul. 26, 2023).

Cline, Brian et al., "Next-Gen Chips will be Powered from Below," IEEE Spectrum, https://spectrum.ieee.org/next-gen-chips-will-be-powered-from-below, Aug. 26, 2021 (printed Mar. 19, 2024), 18 pages.

Horiguchi, Naoto et al., "Imec demonstrates critical building blocks for a backside power delivery network," https://www.imec-int.com/en/articles/imec-demonstrates-critical-building-blocks-backside-power-delivery-network, Jun. 10, 2021 (printed Mar. 19, 2024), 28 pages.

Kennedy, Patrick, "Intel Announces it is 3 Years Behind AMD and NVIDIA in XPU HPC," STH, https://www.servethehome.com/intel-announces-it-is-ending-traditional-hpc-platforms/, Mar. 3, 2023 (printed Mar. 19, 2024), 6 pages.

Moore, Samuel K., "Intel Is All-In on Backside Power Delivery," IEEE Spectrum, https://spectrum.ieee.org/backside-power-delivery, Jun. 8, 2023, 9 pages.

Morrison, Jim et al., "Samsung Galaxy S7 Edge Teardown," Tech Insights (posted Apr. 24, 2016), includes description of hybrid bonded Sony IMX260 dual-pixel sensor, https://www.techinsights.com/blog/samsung-galaxy-s7-edge-teardown, downloaded Jul. 11, 2023, 9 pages.

"New Ways to Wire and Integrate Chips," Applied Materials, Master Class, May 26, 2022, 62 pages.

O'Laughlin, Doug, "Backside Power Delivery and Bold Bets at Intel," Fabricated Knowledge, https://www.fabricatedknowledge.com/p/backside-power-delivery-and-bold, Jun. 19, 2022 (printed Mar. 19, 2024), 13 pages.

ONSEMI AR0820 image, cross section of a CMOS image sensor product. The part in the image was shipped on Sep. 16, 2021. Applicant makes no representation that the part in the image is identical to the part identified in the separately submitted reference BUSH, Nov. 8, 2018, ElectronicsWeekly.com ("BUSH article"); however, the imaged part and the part shown in the BUSH article share the part number "ONSEMI AR0820.". 1 page.

Prasad, Divay, "Can we Bury our Scaling Problems with Buried Power Rails and Backside Power Delivery?," arm Community, https://community.arm.com/arm-research/b/articles/posts/can-we-bury-our-scaling-problems-with-buried-power-rails-and-back-side-power-delivery, Mar. 5, 2020 (printed Mar. 19, 2024), 6 pages.

Smith, Ryan, "CES 2023: AMD Instinct MI300 Data Center APU Silicon in Hand—146B Transistors, Shipping H2'23," AnandTech, https://www.anandtech.com/show/18721/ces-2023-amd-instinct-mi300-data-center-apu-silicon-in-hand-146b-transistors-shipping-h223, Jan. 5, 2023 (printed Mar. 14, 2024), 7 pages.

Sony IMX260 image, a first cross section of Sony product labeled IMX260, showing a hybrid bonded back side illuminated CMOS image sensor with a pad opening for a wire bond. The second image shows a second cross-section with peripheral probe and wire bond pads in the bonded structure. The part in the images was shipped in Apr. 2016. Applicant makes no representation that the part in the images is identical to the part identified in the separately submitted reference Morrison et al. (Tech Insights article dated Apr. 24, 2016), describing and showing a similar sensor product within the Samsung Galaxy S7; however the imaged part and the part shown in the Morrison et al. article share the part name "Sony IMX260 image," 2 pages.

Clarke, Peter, "Backside of the wafer promised 3D chip improvements," May 20, 2019, https://www.eenewsanalog.com/news/backside-wafer-promises-3d-chip-improvements, downloaded Jul. 5, 2021. 3 pages.

Ker, Ming-Dou et al., "Fully process-compatible layout design on bond pad to improve wire bond reliability in CMOS Ics," IEEE Transactions on Components and Packaging Technologies, Jun. 2002, vol. 25, No. 2, pp. 309-316.

Moriceau, H. et al., "Overview of recent direct wafer bonding advances and applications," Advances in Natural Sciences-Nanoscience and Nanotechnology, 2010, 11 pages.

Nakanishi, H. et al., "Studies on SiO2-SiO2 bonding with hydrofluoric acid. Room temperature and low stress bonding technique for MEMS," Sensors and Actuators, 2000, vol. 79, pp. 237-244.

Oberhammer, J. et al., "Sealing of adhesive bonded devices on wafer level," Sensors and Actuators A, 2004, vol. 110, No. 1-3, pp. 407-412, see pp. 407-412, and Figures 1 (a)-1(I), 6 pages.

Peters, Laura, "Challenges in backside power delivery," https://semiengineering.com/challenges-in-backside-power-delivery, Nov. 17, 2022 (printed Nov. 23, 2022), 14 pages.

Plobi, A. et al., "Wafer direct bonding: tailoring adhesion between brittle materials," Materials Science and Engineering Review Journal, 1999, R25, 88 pages.

International Search Report and Written Opinion for PCT/US2022/078515, dated Feb. 24, 2023, 14 pages.

Flaherty, Nick, "Imec Shows Backside Power Delivery with Buried Power Rails". Technology News Jun. 14, 2022; downloaded from https://www.eenewseurope.com/en/imec-shows-backside-power-delivery-with-buried-power-rails/; 4 pages.

Gupta et al., High-Aspect-Ratio Ruthenium Lines for Buried Power Rail. In 2018 IEEE International Interconnect Technology Conference (IITC) Jun. 4, 2018 (pp. 4-6).

Mitchell, Robin, "IMEC Demonstrates Buried Power Rails in FinFET CMOS". ElectroPages Article Mar. 17, 2021; downloaded from https://www.electropages.com/blog/2021/03/imec-demonstrates-buried-power-rails-finfet-cmos; 3 pages.

Ryckaert et al., "The Complementary FET (CFET) for CMOS scaling beyond N3". In 2018 IEEE Symposium on VIsi Technology Jun. 18, 2018 (pp. 141-142).

Silicon Semiconductor, "Imec Demonstrates Si FinFET CMOS Devices with Integrated Tungsten Buried Power Rails". News Article Jun. 22, 2020; downloaded from https://siliconsemiconductor.net/article/111494/Imec_Demonstrates_Si_FinFET_CMOS_Devices_With_Integrated_Tungsten_Buried_Power_Rails; 13 pages.

(56)                References Cited

OTHER PUBLICATIONS

Tyler, Neil., "Imec Demonstrates Si FinFET CMOS Devices". NewElectronics News Article Jun. 17, 2020, downloaded from https://www.newelectronics.co.uk/content/news/imec-demonstrates-si-finfet-cmos-devices; 6 pages.
European Extended Search Report dated Aug. 19, 2025 for Application No. 22888403.7, 15 pages.

\* cited by examiner

POWER DISTRIBUTION FOR STACKED ELECTRONIC DEVICES

CROSS-REFERENCE TO RELATED APPLICATIONS

This application claims priority to U.S. Provisional application No. 63/263,004, filed Oct. 25, 2021, titled "POWER DISTRIBUTION FOR STACKED ELECTRONIC DEVICES," the disclosure of which is incorporated herein by reference in its entirety for all purposes.

BACKGROUND

Field

The field relates to stacked electronic devices, and in particular, to power distribution for stacked electronic devices.

Description of the Related Art

Multiple semiconductor elements (such as integrated device dies) may be stacked on top of one another in various applications, such as processors, high bandwidth memory (HBM) devices, or other devices that utilize vertical integration. The stacked elements can electrically communicate with one another. Signals and power can be transferred through the dies by way of through substrate vias (TSVs).

BRIEF DESCRIPTION OF THE DRAWINGS

Like reference numbers are used to refer to like features throughout the description and drawings.

DETAILED DESCRIPTION

Figure 1:
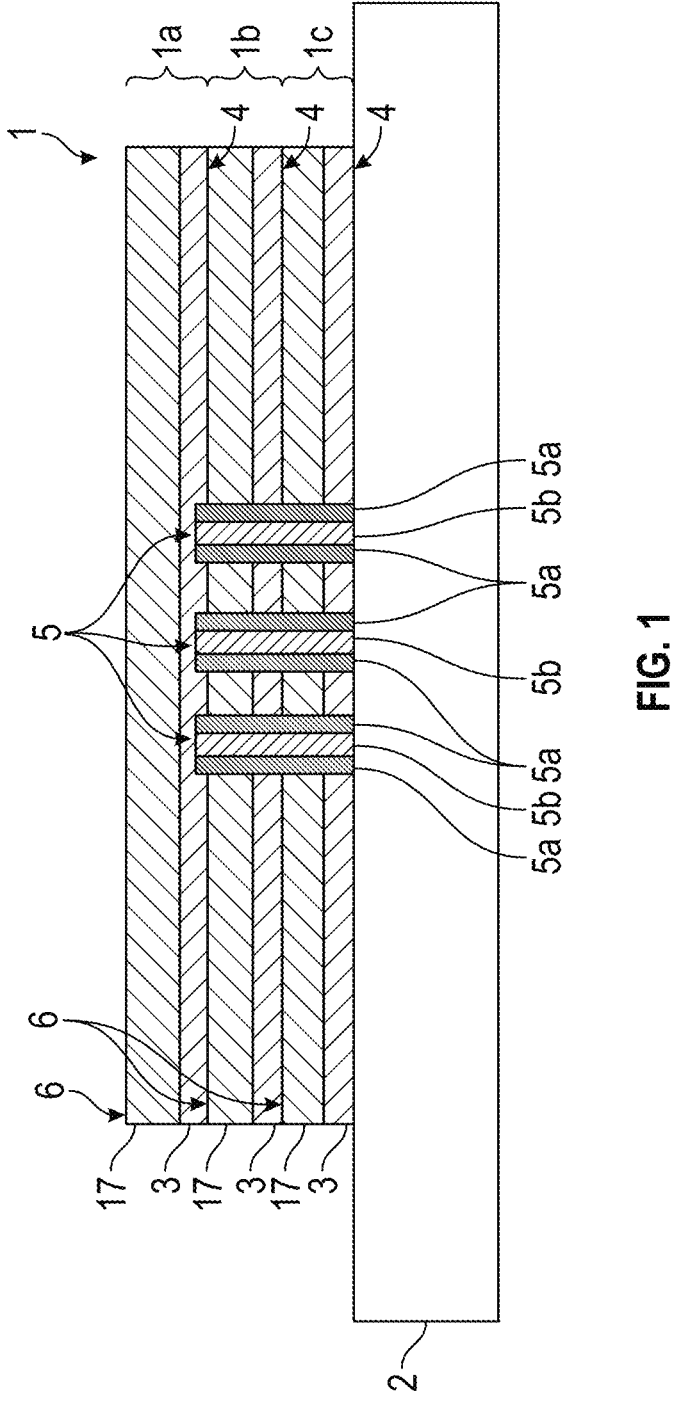
FIG. 1 is a schematic cross section of a stack of multiple integrated device dies, a carrier, and through substrate vias (TSVs) configured for power delivery and signal communication.

Power delivery to multiple dies in a die stack is challenging, and it becomes even more challenging as the stack becomes taller. Currently, the trend for wiring die stacks is by way of through substrate vias (TSVs). Advantageously, direct paths through die stacks can be efficiently provided by way of TSVs, particularly when the die stacks are connected by direct hybrid bonding. For power delivery, however, TSVs are relatively resistant, consume power, generate heat and occupy significant space within the die. Thus, sending power to the top of a die stack becomes more difficult as the number of dies in the stack increases. Various embodiments disclosed herein supply signals through a die stack using TSVs, but supply power to the middle of the stack without passing through lower dies. For example, a power distribution network (PDN) can be provided between an upper surface of a first die and a lower surface of a second die above the first die. In various embodiments, peripheral connections (e.g., wire or tab bonds, conductive paste, plated copper in edge traces) are configured to deliver power to the PDN without first passing through the lower die, allowing TSVs to be used for signal communication without the sacrifices of power delivery through dies. The power can thus be delivered to the dies of the die stack without passing through TSVs in the lower die. In some embodiments, the power is supplied through normal carrier connections (solder balls, direct bonding, wire bonding) and thus through the package, without separate connections to the mother board. In other embodiments, the power can be delivered from the mother board through separate connections (such as wire bonds) to the mother board. Such configurations have utility in applications such as automotive under-the-hood applications where solder bumps are not allowed. For example, in some embodiments, at least one die (e.g., a bottom die) in the die stack can receive power from its upper surface (e.g., back side) while receiving signals from its lower surface (e.g., front side), freeing space at the interface of the carrier and in the back-end-of-line layers of the bottom die. In other examples, signals are provided to middle and upper dies of the stack through TSVs in the lower dies, while power is provide to the middle and upper dies of the stack without first passing through the lower dies.

Power delivery that bypasses a lower die while signals make use of TSVs would benefit the formation of various die stacks in different electronic applications. Such arrangements advantageously facilitate signal delivery with minimal losses, while also facilitating power delivery with minimal losses and heat generations, and such power delivery can be provided in multiple power/voltage domains. Power delivery that is independent of the constraints on signal delivery through TSVs can be beneficial in many different applications.

For example, in radio frequency (RF) communication systems such as cellular systems (e.g., 4G, LTE, 5G, etc.), Bluetooth, WiFi, satellite, etc., a signal chain converts a digital to an RF signal, where the power supply requirements at each point in the signal chain differ from each other. In many applications, there are at least three dies (or chips) in this signal chain: a digital baseband processor; a transceiver, which converts digital signals from the baseband processor into RF transmit signals and converts RF receive signals from the RF front end to digital signals for the baseband processor; and an RF front end, which carries out signal conditioning (e.g., amplification, switching, duplexing, diplexing, and/or filtering). The power distribution network for a multiple die stack as described herein, would allow for the formation of various combinations of these chips. In one embodiment, a die stack may comprise the three chips described in the signal chain (i.e., baseband processor, transceiver, and RF front end). In another embodiment, a die stack may comprise two dies, where a first die further comprises a combination of the baseband processor and transceiver, and a second die comprises the RF front end die. In another embodiment, a die stack may comprise two dies, where a first die comprises a transceiver and a second die comprises an RF front end. In another embodiment, a die stack may comprise two dies, where a first die comprises a baseband processor, and a second die comprises a transceiver and RF front end.

The power distribution for multiple die stacks described herein may also be utilized in controller/voltage regulator chip sets, processor and memory applications, digital processing in combination with an analog front end, and more. For the controller/voltage regulator chip sets, most electronics are powered by some type of voltage regulator. This voltage regulator could be a DC-to-DC converter (e.g., operating from a battery voltage) or an AC-to-DC converter. Examples of voltage regulators include buck converter, boost converter, switching regulator, and power management integrated circuit (PMIC). Each of these types of voltage regulators are controlled by a controller chip (often a pulse width modulation (PWM) controller). The voltage regulator and controller chips operate under different technologies, with the voltage regulator often being a different processing technology (e.g., GaN device).

In processor and memory applications, the possible die stacks that could benefit from signal delivery through TSVs with independent power delivery paths include: stack of two dies where one die comprises a CPU and another die comprises a memory die; stack of two dies where one die comprises a GPU and another die comprises the memory die; stack of two dies where one die comprises the CPU and the other die comprises the GPU; and a stack of three dies where one die comprises the CPU, a second die comprises the GPU, and a third die comprises the memory die. In all of these examples, advantages could be gained by stacking multiple memory dies with processes, where the stack comprises at least two memory dies, the memory die stack further comprising independent signal and power distribution as described herein.

In digital processing with analog front end applications, a digital processing chip (e.g., CPU, microcontroller, or digital signal processing (DSP)) is often combined with an analog front end, which can provide basic amplification of analog signals, as well as conversion from analog to digital or vice versa. The digital processing chip then provides algorithms to process this data. The digital processing chip and analog front end can be combined with a sensor chip in some instances. The analog and digital chips can have different power supply requirements with multiple different voltage domains, and the sensor chip can have yet different power requirements. As such, different stacks of dies may be formed using a plurality of power distribution networks for multiple die stacks described herein: a stack of two dies where one die comprises an analog front end and a second die comprises a digital processing chip; a stack of two dies where one die comprises the analog front end and a second die comprises a sensor; and a stack of three dies where one die comprises a digital processing chip, a second die comprises the analog front end, and a third die comprises the sensor.

Additional examples of technologies that could benefit from the power and signal delivery systems described herein include radar chip sets, LiDAR chip sets (or optical/photonic chip sets more generally), serializer/deserializer (SerDes) chip sets for high speed data transfer, MEMS applications, automotive chip sets, clock and timing distributions. A high performance clock generation chip can be stacked with one or more other chips for wireless infrastructure, instrumentation, or automated test equipment (ATE applications); and bus applications (e.g., bus controller and bus transceiver).

FIG. 1 shows a stack of multiple integrated device dies 1 mounted to a carrier 2, such as another large die, interposer, base device or package substrate (such as a printed circuit board, ceramic substrate, etc.). Metallization layer(s) 3 (such as a back-end-of-line, or BEOL, layer) can be provided over a semiconductor layer 17, comprising a front side 4 of each die. A first die 1a can be mounted face down on the carrier 2, a second middle die 1b can be mounted face down on the first die 1a, and a third upper die 1c can be mounted face down on the second die 1b. Through substrate vias 5 (TSVs), comprising a dielectric lining layer 5a and a conductive material 5b, can extend through the first 1a and second 1b dies to electrically connect to one or more of the first 1a, second 1b, and third dies 1c. For example, as shown, one or more of the TSVs 5 can electrically connect to the first die 1a, the second die 1b, and/or the third die 1c. In the stacked structure of FIG. 1, the TSVs 5 can provide electrical communication to the carrier 2 for power delivery, signal transmission, and ground. However, TSVs have a relatively high resistance, which consumes power delivered along the TSVs. Accordingly, it can be advantageous to reduce power consumption associated with using TSVs for power distribution while maintaining the advantages of TSV use for carrying signals, particularly in conjunction with direct hybrid bonding.

Figure 2:
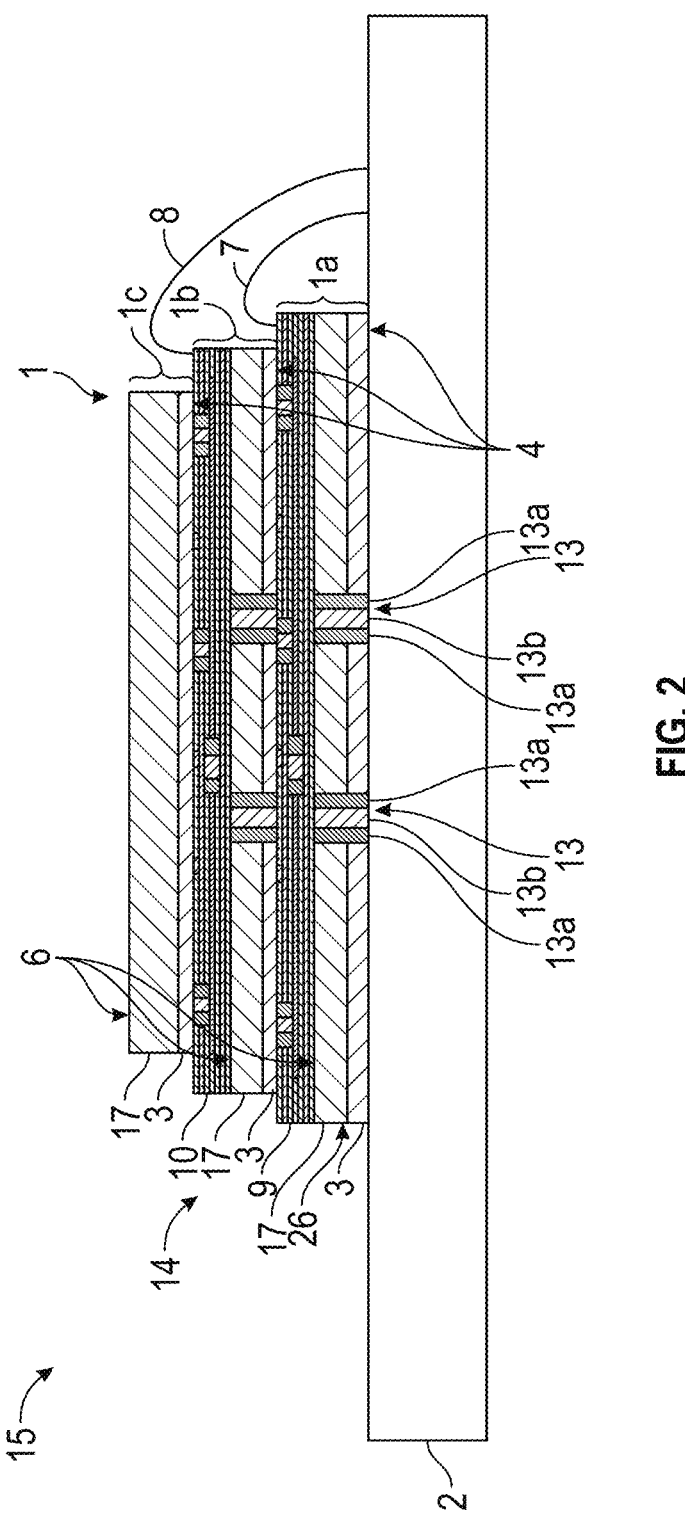
FIG. 2 is a schematic cross section of a stack of multiple integrated device dies arranged in a staircase structure, a carrier, TSVs configured for signal communication, a first set of routing layers and a second set of routing layers, and a first power supply path and a second power supply path, according to one embodiment.

FIG. 2 illustrates a stacked electronic device 15, according to one embodiment. The stacked electronic device 15 comprises a die stack 1 mounted to a carrier 2, such as another large die, interposer, base device, package substrate (such as a printed circuit board, ceramic substrate, etc.), other base device or system board. In some embodiments the die stack 1 forms an IC package to be mounted on a system board. In some embodiments, the stacked electronic device 15, including the carrier 2, forms an IC package to be mounted on a system board. The die stack 1 can include at least three connected dies. The dies can include a first lower die 1a, one or more second middle die(s) 1b (one shown), and a third upper die 1c. The second middle die 1b can be disposed between the first lower die 1a and the third upper die 1c. The first 1a, second 1b, and third 1c dies can comprise the same type of die, or one or more of the dies may be different from one another. In various embodiments, for example, one or more of the dies can comprise a processor die, a memory die, etc. as described above for RF communications chip sets, voltage regulator chip sets, memory stacks over graphics or central processors, digital processing chip sets with analog front ends, radar chip sets, LiDAR chip sets (or optical/photonic chip sets more generally), serializer/deserializer (SerDes) chip sets for high speed data transfer, MEMS applications, automotive chip sets, chip sets for clock and timing distributions, etc. Each die can have a front active side 4 and a back side 6. Active circuitry (e.g., at least one transistor) can be disposed at or near the front active side 4. In some embodiments, the back side 6 may be devoid of active circuitry.

One or a plurality of through substrate vias (TSVs) 13, each comprising a dielectric layer 13a and a conductive material 13b, can be provided at least through the first lower die 1a and the second middle die 1b to provide signal transmission to the dies of the stack 1. The semiconductor layer 17 can comprise a bulk or epitaxial single crystal semiconductor material for an integrated circuit die, or can comprise other substrate materials such as quartz or ceramic for other types of devices, such as interposers. As shown in FIG. 2, the TSVs 13 may provide only signal transmission and may not distribute electrical power to the second 1b and third 1c dies. Rather, as shown in FIG. 2, a first external power supply path 7 (e.g., a first wire bond or tab bond) can be configured to provide power to the second middle die 1b and/or other dies in the stack. A second external power supply path 8 (e.g., a second wire bond or tab bond) can be configured to provide power to the third upper die 1c. The external power supply paths 7, 8 can provide power to the middle die 1b and/or the upper die 1c from a die or board below the lower die 1a (such as from the illustrated carrier 2) such that the supply paths 7, 8 bypass the lower die 1a. In some embodiments, power delivery to the lower die 1a may be supplied from the lower surface (front side 4 in the illustrated orientation) of the lower die 1a. In other embodiments, power delivery to the lower die may be supplied from a side 26 of the lower die. In other embodiments, the external power supply path provides power to the middle die and/or the lower die from a power source above the upper die and bypasses the upper die. In still other embodiments, some of the power supplies for the middle and/or upper dies are provided through TSVs in the lower die while other power supplies for the middle and/or upper dies are provided through external power supply paths, such as the illustrated wire bonds, without passing through the lower die.

In FIG. 2, the lower die 1a is mounted face down (e.g., front active side 4 down) over the carrier 2, the middle die 1b is mounted face down (e.g., front active side 4 down) over the lower die 1a, and the third die 1c is mounted face down (e.g., front active side 4 down) over the middle die 1b. In some embodiments, the back side 6 can be devoid of active circuitry. Thus, in the illustrated embodiment, with the active or front sides 4 of the dies 1a, 1b, 1c facing down, the lower surfaces of the dies in the stack are the front sides 4 of the dies, whereas the upper surfaces of the dies are the back sides 6. The skilled artisan will recognize that, in other embodiments, some or all of the dies can instead be stacked face up such that their upper surfaces are their front sides. As shown, the upper surface (the back side 6 in the illustrated embodiment) of the lower die 1a includes a first routing structure 9 comprising a first power distribution network (PDN) configured to distribute power from the first external power supply path 7 (lower wire bond) to the middle die 1b. The upper surface (back side 6 in the illustrated embodiment) of the middle die 1b may also include a second routing structure 10 comprising a PDN configured to distribute power from the second external supply path 8 (upper wire bond) to the upper die 1c. Further, the routing structures 9, 10 on upper surfaces of the lower die 1a and/or the middle die 1b can further comprise a ground distribution network. A ground connection path can also extend to the middle die 1b and/or the upper die 1c from the outside of the stack 1 (e.g., by way of additional wire bonds or tab bonds). In some embodiments, the first and/or second power supply path can have a cross-sectional area more than 2 times an average cross-sectional area of the TSVs, or more than 4 times an average cross-sectional area of the TSVs, or more than 10 times an average cross-sectional area of the TSVs, or more than 20 times an average cross-sectional area of the TSVs.

The routing structures 9, 10 are illustrated as multilayer structures integral with the dies below them, including multiple deposited and patterned metal layers separated by deposited dielectric layers and connected by vias, similar to redistribution layers (RDL). Inorganic dielectric layers, such as described below, can advantageously facilitate direct hybrid bonding. The skilled artisan will appreciate that, while the illustrated routing structures are deposited and patterned layers integral with the dies below them, in other embodiments the routing structures that distribute power from external power supply paths to the dies need not be so formed. For example, in some embodiments, the routing structures can be formed integrally with the lower surface of the die above (front sides 4 of the middle and upper dies 1b, 1c). In still other embodiments, distribution of the externally supplied power can be accomplished within metallization layers 3 (e.g., BEOL) of the dies themselves. However, the illustrated separate routing structures 9, 10 between dies of the stack, whether laterally co-extensive with the overlying or underlying dies, can advantageously provide more conductive paths for the power supplies compared to most BEOL lines. The skilled artisan will appreciate that the routing structures 9, 10 can also include isolation features between ground and power/voltage domains, and/or between voltage domains. For example, capacitor and/or inductor structures can be provided within the routing structure between power delivery layers or between laterally separated voltage domains for separate power supplies.

As shown in FIG. 2, the stack can comprise a staircase profile 14 providing ledges for wire bond connection. Accordingly, the die stack comprises differently sized dies. For example, larger dies such as processor dies can be on the bottom of the stack, whereas smaller dies are provided for the middle and/or upper dies. Edges of dies of the die stack can be laterally shifted with respect to one another to provide the ledges. In other embodiments, the stack can comprise same-sized dies, and the dies can be shifted laterally to provide the ledges. In some embodiments, different voltages are provided for different dies of the die stack. Furthermore, although only one bond wire 7, 8 is illustrated in the schematic cross section of FIG. 2 at each die level for middle/upper dies, the skilled artisan will understand that more than one power supply can be provided to each die through multiple external power supply paths (e.g., multiple wire bonds at each routing structure 9, 10) at the same level. Thus, multiple power/voltage domains can be supplied at each level. In some embodiments, the external power supply path delivers power to the middle die through a back side of the middle die. For example, the upper wire bond (the second supply path) can connect to the second routing structure to provide power to the middle die through the back side of the middle die. In other embodiments, the external power supply path delivers power to the middle die through a front side of the middle die. For example, the lower wire bond (the first supply path) can connect to the first PDN adjacent the front side of the middle die to provide power to the front side of the middle die. As explained above, in some embodiments, there may be no TSV that delivers power through a portion of the die stack. In other embodiments, there may be additional internal power supply paths through power TSVs that extend through the first and/or second dies.

Although the die stack 1 of FIG. 2 includes three dies, in other embodiments, the die stack can comprise multiple middle dies between the upper and lower dies such that the die stack includes four or more total dies. In some embodiments, separate external power supply paths can be provided for each of the middle dies. In other embodiments, separate external power supply paths are provided for some of the middle dies, while internal power supply paths (e.g., power TSVs) are provided for others of the middle dies.

The lower die 1a can be mounted to the carrier 2 in any suitable manner. In the illustrated embodiments, the lower die 1a is direct hybrid bonded to the carrier, providing reliable mechanical connections from die to carrier, and reliable, low resistance connections for signals, ground and any internal power supplies. In other embodiments, however, the lower die can be bonded to the carrier with another bonding technique, such as thermocompression bonding (TCB), solder bonding, etc. The middle die 1b can be bonded to the lower die 1a in any suitable way, and the upper die 1c can be bonded to the middle die 1b in any suitable way. In some embodiments, the middle die 1b is direct hybrid bonded to the lower die 1a, and the upper die 1c is direct hybrid bonded to the middle die 1b by way of the intervening routing structures 9, 10 respectively. Thus, relevant surfaces of the dies and/or routing structures 9, 10 can include inorganic dielectric materials prepared for direct bonding, as described below, including high degrees of polishing and activation/termination. In other embodiments, one or more of the dies can be bonded with another bonding technique, such as TCB, solder bonding, etc.

Figure 3:
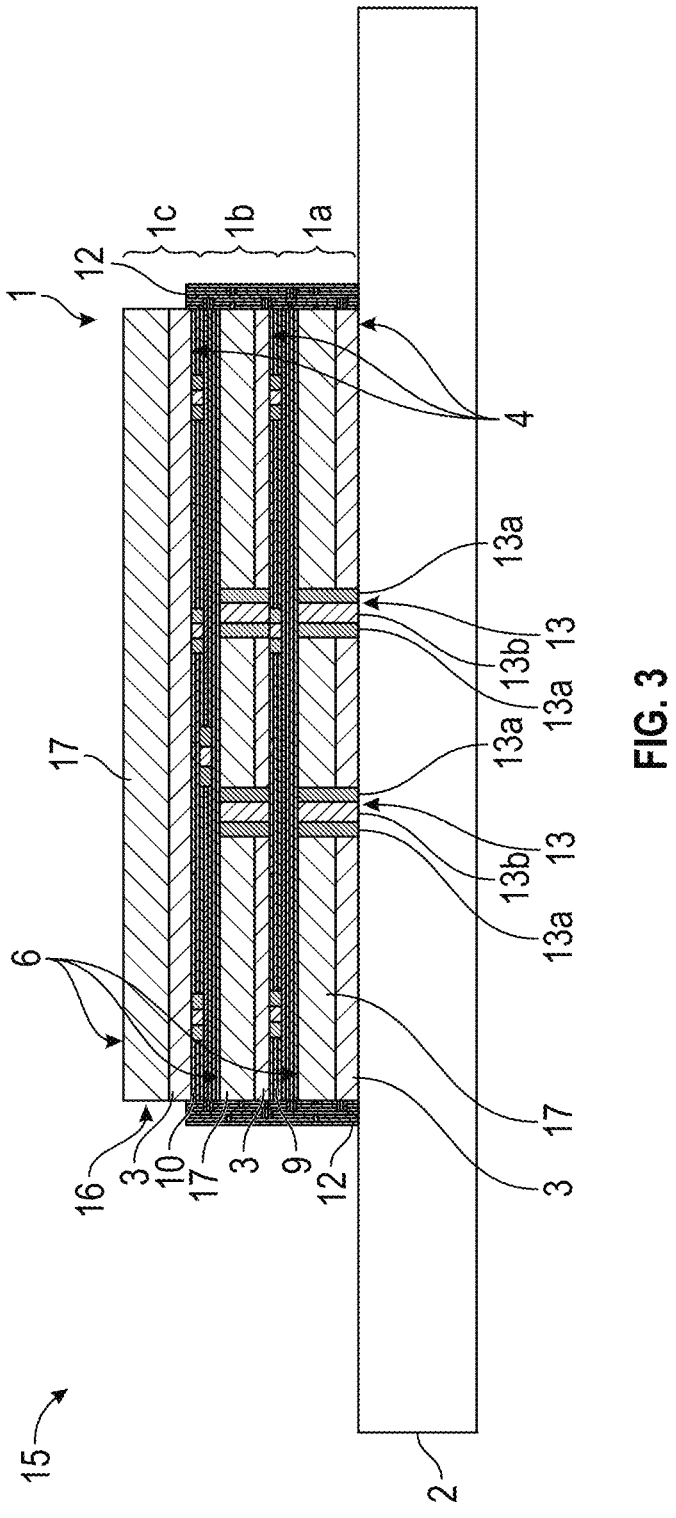
FIG. 3 is a schematic cross section of a stack of multiple integrated device dies, a carrier, TSVs configured for signal communication, a first and second sets of routing layers, and edge traces on the sidewalls of the stack, according to another embodiment.

FIG. 3 illustrates a stacked electronic device 15, according to another embodiment. Unless otherwise noted, the components of FIG. 3 are the same as or generally similar to the components of FIG. 2, and alternatives noted above with respect to FIG. 2 are likewise applicable to the embodiment of FIG. 3. Unlike FIG. 2, in which the external power supply pathways comprise wire bonds or tab bonds, in the embodiment of FIG. 3, the external power supply pathways comprise one or more edge traces 12 (which may also be referred to as sidewall traces) along a sidewall 16 of the die stack 1. In some embodiments, the edge trace 12 comprises a cured conductive paste. In some embodiments, the edge trace 12 comprises a plated metal such as copper. As with the routing structures 9, 10 described above with respect to FIG. 2, the edge trace 12 can comprise multiple patterned metal layers separated by dielectric layers and connected by vias, and can include isolation between ground and power traces or levels, and/or between traces or levels representing different voltage domains. In various embodiments, the edge traces 12 may be generally similar to those described in U.S. Pat. No. 8,461,673, the entire contents of which are incorporated by reference herein in their entirety and for all purposes.

Figure 4:
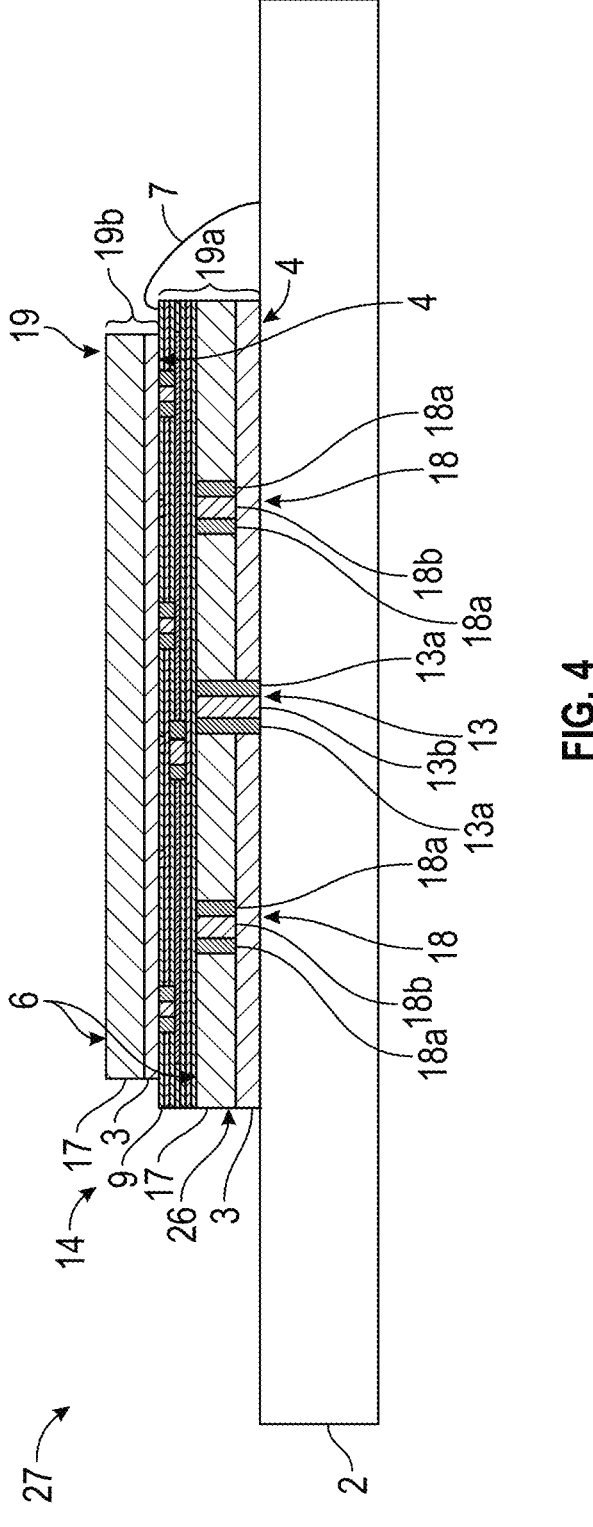
FIG. 4 is a schematic cross section of a stack of two integrated device dies, a carrier, TSVs configured for signal communication and power delivery, a first set of routing layers, and a first power supply path, according to one embodiment.

FIG. 4 illustrates a stacked electronic device 27, according to another embodiment. Unless otherwise noted, the components of FIG. 4 are the same as or generally similar to the components of FIG. 2, and alternatives noted above with respect to FIG. 2 are likewise applicable to the embodiment of FIG. 3. Additionally, although the external power supply path of FIG. 4 is shown to be a wire bond 7 similar to that of FIG. 2, the external supply path of FIG. 4 can instead take the form of edge traces similar to those of FIG. 3.

In FIG. 4, the stacked electronic device 27 comprises a die stack 19 mounted to a carrier 2, such as another large die, interposer, base device, package substrate (such as a printed circuit board, ceramic substrate, etc.), other base device, or system board. The die stack 19 can include at least two connected dies. The dies can include a first lower die 19a, and a second upper die 19b. One or a plurality of through substrate vias (TSVs) 13, each comprising a dielectric layer 13a and a conductive material 13b, can be provided at least through the first lower die 19a to provide signal transmission to the dies of the stack 19. As described for the embodiments of FIGS. 2 and 3, the TSVs 13 may provide only signal transmission, or may additionally provide ground or reference voltage, and in come embodiments may also provide a subset of power supplies. As shown in FIG. 4, a first external power supply path 7 (shown as a first wire bond or tab bond)

can be configured to provide power to at least the devices of the first die 19a. The external power supply path 7 can provide power to the lower die 19a from a board below the lower die 19a (such as the illustrated carrier 2) such that the supply path 7 bypasses the lower die 19a.

In FIG. 4, the lower die 19a is mounted face down (e.g., front active side 4 is the lower surface) over the carrier, and the upper die 19b is mounted face down (e.g., front active side 4 is the lower surface) over the lower die 19a. In some embodiments, the back side 6 can be devoid of active circuitry. As shown, a back side 6 of the lower die 19a includes a first routing structure 9 comprising a first PDN configured to distribute power from the first external power supply path 7 (wire bond in the illustrated embodiment) to the lower die 19a. Further, the back side 6 of the lower die 19a can further comprise a ground distribution network. A ground connection path can also extend to the lower die 19a and/or the upper die 19b from the outside of the stack 19 (e.g., by way of additional wire bonds or tab bonds), just as additional external power supply paths can connect to the routing structure 9. A plurality of TSVs 18, comprising a dielectric liner layer 18a and a conductive material 18b, can extend through at least the substrate of the lower die 19a to provide power delivery from the upper surface (routing structure 9) to devices of the lower die 19a. Because these TSVs 18 only pass through the substrate portion of the lower die 19a, and not (all of) the metallization layers 3, they can be considered "nano-TSVs." Advantageously, the power need not be routed through the crowded metallization layers 3 (e.g., BEOL) of the lower die 19a, at least for the power supplies provided through external power pathways 7. In some embodiments, the upper die 19b may also receive power delivery from the first routing structure 9 comprising the first PDN, and additional middle or upper dies can be provided over the illustrated die stack 19. The dies can be direct hybrid bonded to one another, and the lower die 19a can also be direct hybrid bonded to the carrier 2.

Figure 5:
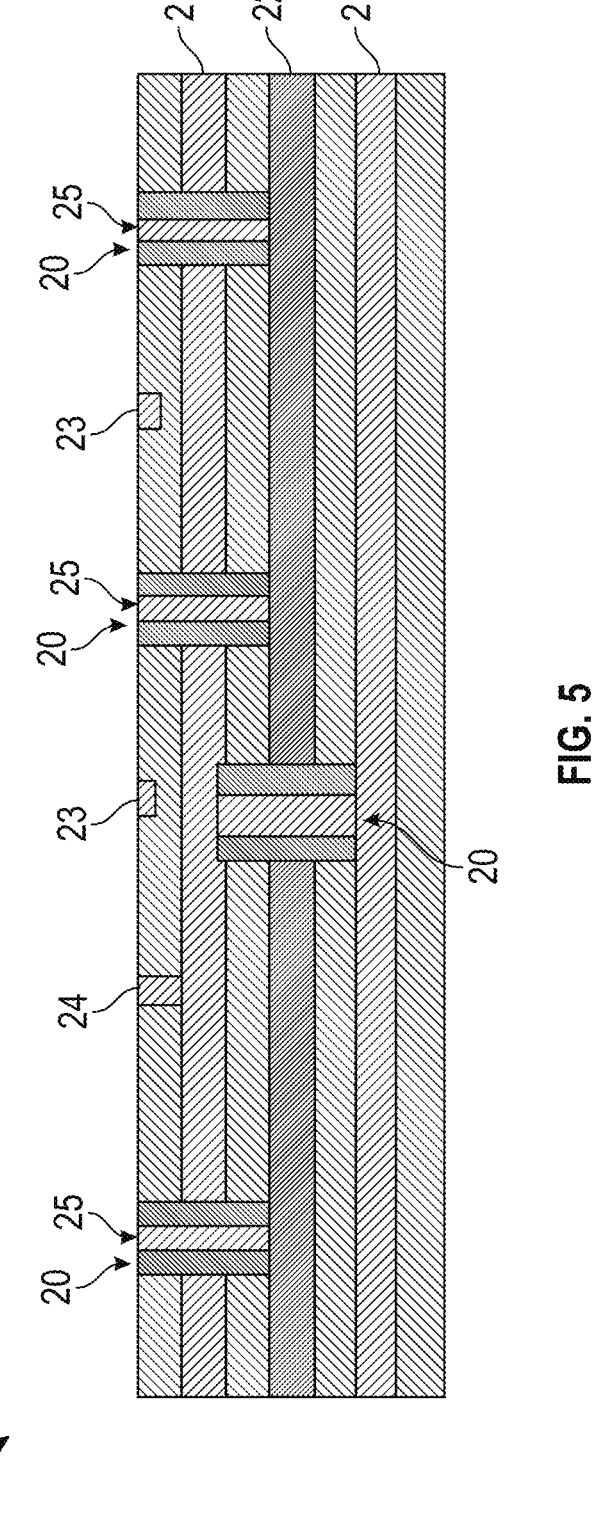
FIG. 5 is a schematic cross section of a set of routing layers including a power delivery network (PDN), according to one embodiment.

FIG. 5 illustrates an expanded view of the routing layer 9 comprising multiple separated metal layers in one embodiment. For example, as shown in FIG. 5, the multiple separated metal layers may further comprise ground layers 21 and a power layer 22. A plurality of vias 20 is configured to connect different layers in the routing layer 9 to each other and/or to the overlying and/or underlying dies in the die stack. Power pads 25 provide a connection from the vias 20 connected to the power layer 22 to a die, and ground pads 24 provide a connection from the ground layers 21 to a die. The routing layer 9 further comprises a plurality of signals pads 23, each providing a connection from a die to a TSV configured to deliver signals through other conductive paths through the routing layer 9 (not shown). In some embodiments, there may be a plurality of power layers, each power layer providing power from a single power source for a single voltage domain, and connecting to overlying or underlying dies in the die stack through separate power pads 25. In one embodiment, there may be a first power layer providing a first voltage and a second power layer providing a second voltage, where the first and second voltages may be the same or different. In other embodiments, a single power layer may be patterned to carry multiple power supplies for a plurality of voltage domains, where each voltage domain is configured to provide independent voltages. In one embodiment, there may be a first power layer comprising a first voltage domain providing a first voltage and a second voltage domain providing a second voltage, where the first voltage of the first voltage domain may be the same as or different from the second voltage of the second voltage domain. As noted above, isolation structures, such as capacitors and/or inductors, can also be provided between ground and power traces or levels, and/or between power traces for different voltage domains.

Figure 6:
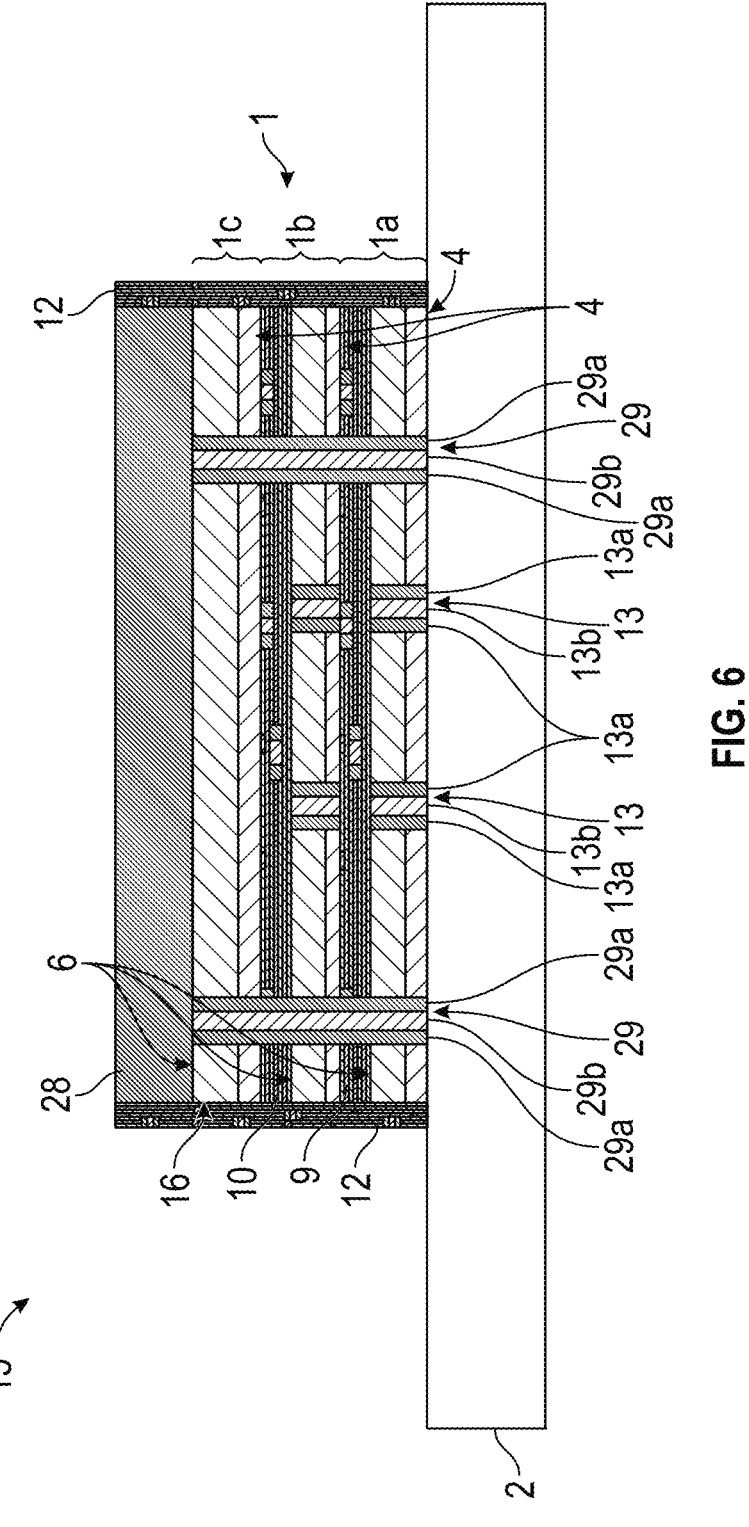
FIG. 6 is a schematic cross section of a stack of multiple integrated device dies, a carrier, TSVs configured for signal communication, a first and second sets of routing layers, and edge traces on the sidewalls of the stack, and a heat sink overlying the die stack according to another embodiment.

FIG. 6 illustrates another embodiment showing a die stack 15 that includes an overlying element unrelated to power delivery on the top of the dies. In the illustrated embodiment, the overlying element can be heat sink 28, which can be directly bonded to the top surface (e.g., back side) of the top die 1c or to an intervening routing structure (not shown). Such a heat sink might be precluded if power had to be delivered from the top side, rather than from the side of the stack 15 as shown. In the illustrated embodiment, edge traces 12 provide power to the middle die(s) 1b, and can also provide power to the bottom die 1a and top die 1c. Additionally, power, ground and/or other traces in the edge traces 12 can provide heat paths from the lower and middle dies 1a, 1b to the heat sink 28. Intervening routing structures 9, 10 can also aid in extracting heat from the dies and routing the heat through the illustrated edge traces 12 to the heat sink 28. Additionally, or alternatively, heat paths from the die stack 15 can be provided by TSVs 29, including dielectric layers 29a and conductive layers 29b, which can be stacked TSVs for each die, like the TSVs 13, or can be via-last TSVs through the die stack 15 including routing structures 9, 10. Such TSVs can aid in heat extraction to the heat sink 28. The illustrated TSVs 29 can additionally serve to carry power, ground or signals if they connect thermally with the heat sink 28 without connecting electrically (e.g., through an electrically insulating but thermally conductive intervening layer). In some embodiments, the heat sink 28 can also be grounded and is electrically connected to ground planes of the die stack 15. Because power is delivered to the dies' backsides from side paths outside the die stack 15, the heat sink 28 does not interfere with backside power delivery.

Examples of Direct Bonding Methods and Directly Bonded Structures

Various embodiments disclosed herein relate to directly bonded structures in which two or more elements can be directly bonded to one another without an intervening adhesive. Two or more elements may be directly bonded to one another at a bond interface without an intervening adhesive. Two or more microelectronic elements (such as semiconductor elements, including, for example, integrated device dies, wafers, passive devices, individual active devices such as power switches, etc.) may be stacked on or bonded to one another to form a bonded structure. Conductive features (e.g., contact pads, exposed ends of vias (e.g., TSVs), or a through substrate electrodes) of one element may be electrically connected to corresponding conductive features of another element. Any suitable number of elements can be stacked in the bonded structure. For example, a third element can be stacked on the second element, a fourth element can be stacked on the third element, and so forth. Additionally, or alternatively, one or more additional elements can be stacked laterally adjacent one another along the first element. In some embodiments, the laterally stacked additional element may be smaller than the second element. In some embodiments, the laterally stacked additional element may be two times smaller than the second element.

In some embodiments, the elements are directly bonded to one another without an adhesive. In various embodiments, a non-conductive field region that includes a non-conductive or dielectric material can serve as a first bonding layer of the first element which can be directly bonded to a corresponding non-conductive field region that includes a non-conductive or dielectric material serving as a second bonding layer of the second element without an adhesive. The non-conductive bonding layers can be disposed on respective front sides of device portions, such as a semiconductor (e.g., silicon) portion of the elements. Active devices and/or circuitry can be patterned and/or otherwise disposed in or on the device portions. Active devices and/or circuitry can be disposed at or near the front sides of the device portions, and/or at or near opposite backsides of the device portions. Bonding layers can be provided on front sides and/or back sides of the elements. The non-conductive material can be referred to as a non-conductive bonding region or bonding layer of the first element. In some embodiments, the non-conductive bonding layer of the first element can be directly bonded to the corresponding non-conductive bonding layer of the second element using dielectric-to-dielectric bonding techniques. For example, non-conductive or dielectric-to-dielectric bonds may be formed without an adhesive using the direct bonding techniques disclosed at least in U.S. Pat. Nos. 9,564,414; 9,391,143; and 10,434,749, the entire contents of each of which are incorporated by reference herein in their entirety and for all purposes. It should be appreciated that in various embodiments, the bonding layers can comprise a non-conductive material such as a dielectric material, such as silicon oxide, or an undoped semiconductor material, such as undoped silicon. Suitable dielectric bonding surface or materials for direct bonding include but are not limited to inorganic dielectrics, such as silicon oxide, silicon nitride, or silicon oxynitride, or can include carbon, such as silicon carbide, silicon oxycarbonitride, low K dielectric materials, SiCOH dielectrics, silicon carbonitride or diamond-like carbon or a material comprising a diamond surface. Such carbon-containing ceramic materials can be considered inorganic, despite the inclusion of carbon. In some embodiments, the dielectric materials do not comprise polymer materials, such as epoxy, resin or molding materials.

In some embodiments, the device portions can have a significantly different coefficients of thermal expansion (CTEs) defining a heterogenous structure. The CTE difference between the device portions, and particularly between bulk semiconductor, typically single crystal portions of the device portions, can be greater than 5 ppm or greater than 10 ppm. For example, the CTE difference between the device portions can be in a range of 5 ppm to 100 ppm, 5 ppm to 40 ppm, 10 ppm to 100 ppm, or 10 ppm to 40 ppm. In some embodiments, one of the device portions can comprise optoelectronic single crystal materials, including perovskite materials, that are useful for optical piezoelectric or pyro-electric applications, and the other of the device portions comprises a more conventional substrate material. For example, one of the device portions comprises lithium tantalate (LiTaO3) or lithium niobate (LiNbO3), and the other one of the device portions comprises silicon (Si), quartz, fused silica glass, sapphire, or a glass. In other embodiments, one of the device portions comprises a III-V single semiconductor material, such as gallium arsenide (GaAs) or gallium nitride (GaN), and the other one of the device portions can comprise a non-III-V semiconductor material, such as silicon (Si), or can comprise other materials with similar CTE, such as quartz, fused silica glass, sapphire, or a glass.

In various embodiments, direct hybrid bonds can be formed without an intervening adhesive. For example, nonconductive bonding surfaces can be polished to a high degree of smoothness. The nonconductive bonding surfaces can be polished using, for example, chemical mechanical polishing (CMP). The roughness of the polished bonding surfaces can be less than 30 Å rms. For example, the roughness of the bonding surfaces can be in a range of about 0.1 Å rms to 15 Å rms, 0.5 Å rms to 10 Å rms, or 1 Å rms to 5 Å rms. The bonding surfaces can be cleaned and exposed to a plasma and/or etchants to activate the surfaces. In some embodiments, the surfaces can be terminated with a species after activation or during activation (e.g., during the plasma and/or etch processes). Without being limited by theory, in some embodiments, the activation process can be performed to break chemical bonds at the bonding surfaces, and the termination process can provide additional chemical species at the bonding surfaces that improves the bonding energy during direct bonding. In some embodiments, the activation and termination are provided in the same step (e.g., a plasma to activate and terminate the surfaces). In other embodiments, the bonding surfaces can be terminated in a separate treatment to provide the additional species for direct bonding. In various embodiments, the terminating species can comprise nitrogen. For example, in some embodiments, the bonding surface(s) can be exposed to a nitrogen-containing plasma. Further, in some embodiments, the bonding surfaces can be exposed to fluorine. For example, there may be one or multiple fluorine peaks at or near a bond interface between the first and second elements. Thus, in the directly bonded structure, the bond interface between two non-conductive materials (e.g., the bonding layers) can comprise a very smooth interface with higher nitrogen content and/or fluorine peaks at the bond interface. Additional examples of activation and/or termination treatments may be found throughout U.S. Pat. Nos. 9,564,414; 9,391,143; and 10,434,749, the entire contents of each of which are incorporated by reference herein in their entirety and for all purposes. The roughness of the polished bonding surfaces can be slightly rougher (e.g., about 1 Å rms to 30 Å rms, 3 Å rms to 20 Å rms, or possibly rougher) after an activation process.

In various embodiments, conductive features of the first element can also be directly bonded to corresponding conductive features of the second element. For example, a direct hybrid bonding technique can be used to provide conductor-to-conductor direct bonds along the bond interface that includes covalently direct bonded non-conductive-to-non-conductive (e.g., dielectric-to-dielectric) surfaces, prepared as described above. In various embodiments, the conductor-to-conductor (e.g., conductive feature to conductive feature) direct bonds and the dielectric-to-dielectric hybrid bonds can be formed using the direct bonding techniques disclosed at least in U.S. Pat. Nos. 9,716,033 and 9,852,988, the entire contents of each of which are incorporated by reference herein in their entirety and for all purposes. In direct hybrid bonding embodiments described herein, conductive features are provided within non-conductive bonding layers, and both conductive and nonconductive features are prepared for direct bonding, such as by the planarization, activation and/or termination treatments described above. Thus, the bonding surface prepared for direct bonding includes both conductive and non-conductive features.

For example, non-conductive (e.g., dielectric) bonding surfaces (for example, inorganic dielectric surfaces) can be prepared and directly bonded to one another without an intervening adhesive as explained above. Conductive contact features (e.g., conductive features and which may be at least partially surrounded by non-conductive dielectric field regions within the bonding layers) may also directly bond to one another without an intervening adhesive. In various embodiments, the conductive features can comprise discrete pads or traces at least partially embedded in the nonconductive field regions. In some embodiments, the conductive contact features can comprise exposed contact surfaces of through substrate vias (TSVs), such as through silicon vias. In some embodiments, the respective conductive features can be recessed below exterior (e.g., upper) surfaces (non-conductive bonding surfaces) of the dielectric field region or non-conductive bonding layers, for example, recessed by less than 30 nm, less than 20 nm, less than 15 nm, or less than 10 nm, for example, recessed in a range of 2 nm to 20 nm, or in a range of 4 nm to 10 nm. In various embodiments, prior to direct bonding, the recesses in the opposing elements can be sized such that the total gap between opposing contact pads is less than 15 nm, or less than 10 nm. The non-conductive bonding layers can be directly bonded to one another without an adhesive at room temperature in some embodiments and, subsequently, the bonded structure can be annealed. Upon annealing, the conductive features can expand and contact one another to form a metal-to-metal direct bond. Beneficially, the use of Direct Bond Interconnect, or DBI®, techniques commercially available from Adeia of San Jose, CA, can enable high density of conductive features to be connected across the direct bond interface (e.g., small or fine pitches for regular arrays). In some embodiments, the pitch of the conductive features, such as conductive traces embedded in the bonding surface of one of the bonded elements, may be less than 100 microns or less than 10 microns or even less than 2 microns. For some applications, the ratio of the pitch of the conductive features to one of the dimensions (e.g., a diameter) of the bonding pad is less than 20, or less than 10, or less than 5, or less than 3 and sometimes desirably less than 2. In other applications, the width of the conductive traces embedded in the bonding surface of one of the bonded elements may range between 0.3 to 20 microns (e.g., in a range of 0.3 to 3 microns). In various embodiments, the conductive features and/or traces can comprise copper or copper alloys, although other metals may be suitable. For example, the conductive features disclosed herein, can comprise fine-grain metal (e.g., a fine-grain copper).

Thus, in direct bonding processes, a first element can be directly bonded to a second element without an intervening adhesive. In some arrangements, the first element can comprise a singulated element, such as a singulated integrated device die. In other arrangements, the first element can comprise a carrier or substrate (e.g., a wafer) that includes a plurality (e.g., tens, hundreds, or more) of device regions that, when singulated, form a plurality of integrated device dies. Similarly, the second element can comprise a singulated element, such as a singulated integrated device die. In other arrangements, the second element can comprise a carrier or substrate (e.g., a wafer). The embodiments disclosed herein can accordingly apply to wafer-to-wafer (W2 W), die-to-die (D2D), or die-to-wafer (D2 W) bonding processes. In wafer-to-wafer (W2 W) processes, two or more wafers can be directly bonded to one another (e.g., direct hybrid bonded) and singulated using a suitable singulation process. After singulation, side edges of the singulated structure (e.g., the side edges of the two bonded elements) may be substantially flush and may include markings indicative of the common singulation process for the bonded structure (e.g., saw markings if a saw singulation process is used).

As explained herein, the first and second elements can be directly bonded to one another without an adhesive, which is different from a deposition process and results in a structurally different interface compared to a deposition. In one application, a width of the first element in the bonded structure is similar to a width of the second element. In some other embodiments, a width of the first element in the bonded structure is different from a width of the second element. Similarly, the width or area of the larger element in the bonded structure may be at least 10% larger than the width or area of the smaller element. The first and second elements can accordingly comprise non-deposited elements. Further, directly bonded structures, unlike deposited layers, can include a defect region along the bond interface in which nanometer-scale voids (nanovoids) are present. The nanovoids may be formed due to activation of the bonding surfaces (e.g., exposure to a plasma). As explained above, the bond interface can include concentration of materials from the activation and/or last chemical treatment processes. For example, in embodiments that utilize a nitrogen plasma for activation, a nitrogen peak can be formed at the bond interface. The nitrogen peak can be detectable using secondary ion mass spectroscopy (SIMS) techniques. In various embodiments, for example, a nitrogen termination treatment (e.g., exposing the bonding surface to a nitrogen-containing plasma) can replace OH groups of a hydrolyzed (OH-terminated) surface with $NH_2$ molecules, yielding a nitrogen-terminated surface. In embodiments that utilize an oxygen plasma for activation, an oxygen peak can be formed at the bond interface. In some embodiments, the bond interface can comprise silicon oxynitride, silicon oxycarbonitride, or silicon carbonitride. As explained herein, the direct bond can comprise a covalent bond, which is stronger than van Der Waals bonds. The bonding layers can also comprise polished surfaces that are planarized to a high degree of smoothness.

In various embodiments, the metal-to-metal bonds between the conductive features can be joined such that metal grains grow into each other across the bond interface. In some embodiments, the metal is or includes copper, which can have grains oriented along the (111) crystal plane for improved copper diffusion across the bond interface. In some embodiments, the conductive features may include nanotwinned copper grain structure, which can aid in merging the conductive features during annealing. The bond interface can extend substantially entirely to at least a portion of the bonded conductive features, such that there is substantially no gap between the non-conductive bonding layers at or near the bonded conductive features. In some embodiments, a barrier layer may be provided under and/or laterally surrounding the conductive features (e.g., which may include copper). In other embodiments, however, there may be no barrier layer under the conductive features, for example, as described in U.S. Pat. No. 11,195,748, which is incorporated by reference herein in its entirety and for all purposes.

Beneficially, the use of the hybrid bonding techniques described herein can enable extremely fine pitch between adjacent conductive features, and/or small pad sizes. For example, in various embodiments, the pitch p (i.e., the distance from edge-to-edge or center-to-center) between adjacent conductive features can be in a range of 0.5 microns to 50 microns, in a range of 0.75 microns to 25 microns, in a range of 1 micron to 25 microns, in a range of 1 micron to 10 microns, or in a range of 1 micron to 5 microns. Further, a major lateral dimension (e.g., a pad diameter) can be small as well (e.g., in a range of 0.25 microns to 30 microns, in a range of 0.25 microns to 5 microns, or in a range of 0.5 microns to 5 microns).

As described above, the non-conductive bonding layers can be directly bonded to one another without an adhesive and, subsequently, the bonded structure can be annealed. Upon annealing, the conductive features can expand and contact one another to form a metal-to-metal direct bond. In some embodiments, the materials of the conductive features can interdiffuse during the annealing process.

Example Embodiments of Power Distribution for Stacked Electronic Devices

In one aspect, an apparatus includes: a die stack comprising at least three connected dies, the dies comprising a lower die, an upper die, and a middle die between the lower die and the upper die; a plurality of through substrate vias (TSVs) providing signal transmission to dies of the stack; and a power supply path configured to provide power to the middle die without passing through the lower die.

In some embodiments, the lower die is mounted face down, the middle die is mounted face down over the lower die, and a backside of the lower die includes a power distribution network configured to distribute power from the power supply path to the middle die. In some embodiments, the backside of the lower die further comprises a ground distribution network. In some embodiments, the apparatus can include a capacitor between the power and ground distribution networks and the middle die. In some embodiments, the apparatus can include a second power supply path to provide power to an overlying die of the die stack from outside of the stack, wherein a backside of the middle die comprises a second power distribution network for providing power to the overlying die from the second power supply path to the overlying die. In some embodiments, the apparatus can include a ground connection path to the middle die from the outside of the stack. In some embodiments, the power supply path has a cross-sectional area more than 2 times an average cross-sectional area of the TSVs. In some embodiments, the power supply path has a cross-sectional area more than 4 times an average cross-sectional area of the TSVs. In some embodiments, the power supply path comprises a wire bond. In some embodiments, the apparatus can include a ground wire bond providing ground connections for the middle die. In some embodiments, the stack comprises a staircase profile providing ledges for wire bond connection. In some embodiments, the die stack comprises differently sized dies. In some embodiments, the die stack comprises same sized dies. In some embodiments, edges of the dies of the die stack are laterally shifted with respect to one another to provide the ledges. In some embodiments, the power supply path comprises an edge trace along a sidewall of the die stack. In some embodiments, the edge trace comprises a cured conductive paste. In some embodiments, the edge trace comprises plated metal. In some embodiments, the plated metal is copper. In some embodiments, different voltages are provided for different dies of the die stack. In some embodiments, the power supply path delivers power to the middle die through a backside of the middle die. In some embodiments, the power supply path delivers power to the middle die through a front side of the middle die. In some embodiments, the apparatus can include additional internal power supply paths through power TSVs. In some embodiments, the die stack comprises multiple middle dies between the upper and lower dies, wherein separate power supply paths are provided for each of the middle dies. In some embodiments, the die stack comprises multiple middle dies, where separate power supply paths are provided for some of the middle dies, while internal power supply paths are provided for others of the middle dies. In some embodiments, the separate power supply paths supply different voltages to different ones of the middle dies. In some embodiments, the at least two dies of the die stack are direct hybrid bonded. In some embodiments, the dies of the die stack are direct hybrid bonded to one another. In some embodiments, the power supply path provides power to the middle die from a die or board below the lower die and bypasses the lower die. In some embodiments, the power supply path provides power to the middle die from a power source above the upper die and bypasses the upper die.

In another aspect, an apparatus can include: a plurality of stacked dies including signal through substrate vias (TSVs); and a bond wire or edge trace providing power to one or more dies above the lowest die in the stack and below the highest die in the stack.

In some embodiments, the plurality of stacked dies comprises a lower die, an upper die, and a middle die between the lower die and the upper die, the bond wire or edge trace providing power to the middle die by way of a power distribution network on a back side of the lower die.

In another aspect, a method of manufacturing an electronic module can include mechanically and electrically connecting at least three dies in a stack, including providing signal connections among the dies by way of through substrate vias (TSVs); and providing a power connection path to a middle die of the stack without communicating the power through a TSV.

In some embodiments, the method can include forming a power distribution network on a back surface of a die below the middle die, and connecting the power connection path to the power distribution network. In some embodiments, the method can include forming a capacitor between the power distribution network and the middle die. In some embodiments, the method can include providing separate power supply paths to each of a plurality of middle dies. In some embodiments, the method can include providing separate voltages to separate dies of the stack. In some embodiments, the method can include providing separate power distribution networks on backsides of dies below each middle die that has its own separate power supply path, and connecting the power supply paths to the power distribution networks. In some embodiments, providing the power supply path comprises wire bonding. In some embodiments, the method can include wire bonding a ground connection for the middle die. In some embodiments, mechanically and electrically connecting the at least three dies in the stack comprises positioning the dies to provide ledges for wire bond connection. In some embodiments, providing the power supply path comprises forming an edge trace along a sidewall of the die stack. In some embodiments, forming the edge trace comprises metal plating. In some embodiments, forming the edge trace comprises copper plating. In some embodiments, the method can include providing additional internal power supply paths through power TSVs. In some embodiments, the stack comprises multiple middle dies, the method further comprising supplying separate power supply paths for some of the middle dies, and supplying internal power supply paths through TSVs for others of the middle dies. In some embodiments, mechanically and electrically connecting the at least three dies in the stack comprises direct hybrid bonding the dies.

In another aspect, an apparatus includes: a die stack comprising at least two connected dies, the dies comprising an upper die and a lower die having an active front side and a back side, the upper die mounted over the back side of the lower die; a plurality of through substrate vias (TSVs) through the lower die providing signal transmission to the upper die of the die stack; and a power supply path configured to provide power to the back side of the lower die, the lower die including a power via to convey power from the back side to devices of the lower die without passing through all metallization levels of the lower die.

In some embodiments, the apparatus can include a routing structure between the upper die and the lower die, the routing structure configured to distribute power from the power supply path to the lower die. In some embodiments, the routing structure further comprises a ground distribution network. In some embodiments, the apparatus can further comprise a ground connection path to the lower die from outside of the stack. In some embodiments, the power supply path has a cross-sectional area more than 2 times an average cross-sectional area of the TSVs. In some embodiments, the power supply path has a cross-sectional area more than 4 times an average cross-sectional area of the TSVs. In some embodiments, the power supply path comprises a wire bond. In some embodiments, the apparatus further comprises a ground wire bond providing ground connections for the lower die. In some embodiments, the stack comprises a staircase profile providing ledges for wire bond connection. In some embodiments, the die stack comprises differently sized dies. In some embodiments, the die stack comprises same sized dies. In some embodiments, the edges of the dies of the die stack are laterally shifted with respect to one another to provide the ledges. In some embodiments, the power supply path comprises an edge trace along a sidewall of the die stack. In some embodiments, the edge trace comprises a cured conductive paste. In some embodiments, the edge trace comprises a plated metal. In some embodiments, the plated metal is copper. In some embodiments, multiple different power supplies at different voltages are provided for a die of the die stack. In some embodiments, the power supply path delivers power to the upper die through a backside of the upper die. In some embodiments, the apparatus can further comprise additional internal power supply paths through power TSVs. In some embodiments, the die stack comprises multiple middle dies between the upper and lower dies, wherein separate power supply paths are provided for each of the middle dies. In some embodiments, the die stack comprises multiple middle dies, where separate power supply paths are provided for some of the middle dies, while internal power supply paths are provided for others of the middle dies. In some embodiments, the separate power supply paths supply different voltages to different ones of the middle dies. In some embodiments, the at least two dies of the die stack are direct hybrid bonded. In some embodiments, the dies of the die stack are direct hybrid bonded to one another by way of deposited routing structures.

In another aspect, a die stack comprises: a plurality of stacked dies wherein at least a bottom die of the stacked dies includes signal through substrate vias (TSVs) extending from a lower die surface to an upper die surface; and an external power supply path providing power to at least one die of the stack without passing through the bottom die.

In some embodiments, the external power supply path provides power to the bottom die by way of an upper surface of the bottom die. In some embodiments, the die stack can further comprise a routing structure between the bottom die and an overlying die, wherein the external power supply path physically and electrically connects to the routing structure. In some embodiments, the external power supply path provides power to the bottom die by way of an upper surface of the bottom die. In some embodiments, the external power supply path provides power to the overlying bottom die by way of the routing structure. In some embodiments, the external power supply path comprises a bond wire. In some embodiments, the external power supply path comprises an edge trace. In some embodiments, the stacked dies are connected to one another by direct hybrid bonding.

In some embodiments, a lower surface of the bottom die is additionally attached to a carrier. In some embodiments, direct bonding among dies of the stack is conducted through routing structures including power distribution networks.

In another aspect, an integrated circuit die comprises: a semiconductor substrate portion including a front side including at least portions of integrated devices and a back side; a back-end-of-the-line (BEOL) portion formed over the semiconductor substrate portion, the BEOL portion including metal interconnects; a plurality of signal though substrate vias (TSVs) extending through the BEOL portion and the semiconductor substrate portion; and a power delivery via extending from the back side of the semiconductor portion to the integrated devices without extending throughout the entire BEOL portion.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled," as generally used herein, refers to two or more elements that may be either directly connected, or connected by way of one or more intermediate elements. Likewise, the word "connected," as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Moreover, as used herein, when a first element is described as being "on" or "over" a second element, the first element may be directly on or over the second element, such that the first and second elements directly contact, or the first element may be indirectly on or over the second element such that one or more elements intervene between the first and second elements. Where the context permits, words in the above Detailed Description using the singular or plural number may also include the plural or singular number respectively. The word "or," in reference to a list of two or more items, covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways.

Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. An apparatus comprising:
a die stack comprising at least three connected dies, the at least three connected dies comprising a lower die, an upper die, and a middle die between the lower die and the upper die, wherein the at least three connected dies of the die stack are hybrid bonded to one another, wherein a hybrid bonded interface between two dies of the at least three connected dies comprises conductor-to-conductor direct bonds and dielectric-to-dielectric direct bonds;
a plurality of through substrate vias (TSVs) extending at least through the lower die and providing signal transmission to dies of the die stack; and
a power supply path configured to provide power to the middle die without passing through the lower die.

2. The apparatus of claim 1, wherein the lower die is mounted with its active side face down, the middle die is mounted with its active side face down over the lower die, and a backside of the lower die includes a power distribution network configured to distribute power from the power supply path to the middle die.

3. The apparatus of claim 2, further comprising a second power supply path to provide power to the upper die of the die stack from outside of the die stack, wherein a backside of the middle die comprises a second power distribution network for providing power to the upper die from the second power supply path to the upper die.

4. The apparatus of claim 2, wherein the power supply path comprises an edge trace along a sidewall of the die stack.

5. The apparatus of claim 1, wherein different voltages are provided for different dies of the die stack.

6. The apparatus of claim 1, wherein the die stack comprises multiple middle dies between the upper and lower dies, wherein separate power supply paths are provided for each of the middle dies.

7. The apparatus of claim 6, wherein the separate power supply paths supply different voltages to a die of the die stack without passing through the lower die.

8. The apparatus of claim 1, wherein the die stack comprises multiple middle dies, where separate power supply paths are provided for some of the middle dies without passing through the lower die, while internal power supply paths are provided for others of the middle dies.

9. The apparatus of claim 1, wherein the power supply path has a cross-sectional area more than 2 times an average cross-sectional area of the TSVs.

10. The apparatus of claim 1, wherein the die stack comprises differently sized dies.

11. An apparatus comprising:
a plurality of stacked dies including signal through substrate vias (TSVs) extending through a lowest die in the plurality of stacked dies; and
a bond wire or an edge trace to provide power to one or more dies above the lowest die and below a highest die in the plurality of stacked dies without passing through the lowest die,
wherein the lowest die is hybrid bonded to the one or more dies, and wherein the one or more dies are hybrid bonded to one another, wherein a hybrid bonded interface between the lowest die and the one or more dies comprises conductor-to-conductor direct bonds and dielectric-to-dielectric direct bonds.

12. The apparatus of claim 11, wherein the plurality of stacked dies comprises a lower die, an upper die, and a middle die between the lower die and the upper die, the bond wire or edge trace providing power to the middle die by way of a power distribution network on a back side of the lower die.

13. The apparatus of claim 11, wherein the edge trace provides power to the one or more dies above the lowest die in the stack and below the highest die in the stack, wherein the edge trace comprises a cured conductive paste or a plated metal.

14. A die stack comprising:

a plurality of stacked dies wherein at least a bottom die of the plurality of stacked dies includes signal through substrate vias (TSVs) extending at least through a substrate portion of the bottom die; and an external power supply path providing power to at least one die of the die stack without passing through the bottom die, wherein the at least one die comprises a middle die, wherein the plurality of stacked dies are connected to one another by direct hybrid bonding, and wherein a hybrid bonded interface between two dies of the plurality of stacked dies comprises conductor-to-conductor direct bonds and dielectric-to-dielectric direct bonds.

15. The die stack of claim 14, wherein the external power supply path provides power to the bottom die by way of an upper surface of the bottom die.

16. The die stack of claim 14, further comprising a routing structure between the bottom die and an overlying die of the plurality of stacked dies that overlies the bottom die, wherein the external power supply path physically and electrically connects to the routing structure.

17. The die stack of claim 16, wherein the external power supply path comprises a bond wire.

18. The die stack of claim 16, wherein the external power supply path comprises an edge trace.

19. The die stack of claim 14, wherein a lower surface of the bottom die is attached to a carrier.

20. The die stack of claim 14, wherein direct bonding among the plurality of stacked dies of the die stack is conducted through routing structures including power distribution networks.

* * * * *